United States Patent [19]
Terazono

[11] Patent Number: 5,508,210
[45] Date of Patent: Apr. 16, 1996

[54] ELEMENT ISOLATING METHOD FOR COMPOUND SEMICONDUCTOR DEVICE

[75] Inventor: Shinichi Terazono, Itami, Japan

[73] Assignee: Mitsubishi Denki Kabushiki Kaisha, Tokyo, Japan

[21] Appl. No.: 153,160

[22] Filed: Nov. 17, 1993

[30] Foreign Application Priority Data

Mar. 9, 1993 [JP] Japan .................... 5-047677

[51] Int. Cl.⁶ .................................. H01L 21/265
[52] U.S. Cl. .................. 437/22; 437/20; 437/63; 437/75
[58] Field of Search .................. 437/22, 56, 34, 437/63, 20, 64, 141, 75

[56] References Cited

U.S. PATENT DOCUMENTS

| | | | |
|---|---|---|---|
| 4,698,104 | 10/1987 | Barker et al. | 437/141 |
| 4,728,616 | 3/1988 | Ankri et al. | 437/22 |
| 5,010,381 | 4/1991 | Shiba | 437/22 |
| 5,061,652 | 10/1991 | Bendernagel et al. | 437/25 |
| 5,086,004 | 2/1992 | Quintana | 437/22 |
| 5,182,219 | 1/1993 | Nelson et al. | 437/25 |
| 5,185,274 | 2/1993 | Chang et al. | 437/22 |
| 5,254,492 | 10/1993 | Tserng et al. | 437/56 |
| 5,256,579 | 10/1993 | Lezec et al. | 437/22 |
| 5,302,840 | 4/1994 | Takikawa | 257/194 |

FOREIGN PATENT DOCUMENTS

| | | |
|---|---|---|
| 62-274669 | 11/1987 | Japan . |
| 64-46950 | 2/1989 | Japan . |
| 2-43742 | 2/1990 | Japan . |

Primary Examiner—Brian E. Hearn
Assistant Examiner—Kevin M. Picardat
Attorney, Agent, or Firm—Leydig, Voit & Mayer

[57] ABSTRACT

A method of element isolation includes implanting ions in a compound semiconductor substrate at the periphery of a semiconductor device in the substrate to produce a first insulating region having a region of maximum implanted ion concentration within a buffer layer at the deepest of multiple epitaxially grown layers. Even when there is a redistribution of implanted ions due to thermal processing, the implanted ions diffuse so that the concentration of ions becomes uniform in the depth direction and a thermally stable ion implantation concentration distribution as well as stable device characteristics are obtained. A second insulating region having a resistivity different from that of the first insulating region may be produced in a second ion implantation step, relaxing an electric field at the interface between the insulating region and a gate electrode, securing a stable, high gate junction breakdown voltage. Thus, a highly reliable element isolating technique and a highly reliable device are obtained.

2 Claims, 8 Drawing Sheets

ELEMENT ISOLATING METHOD FOR COMPOUND SEMICONDUCTOR DEVICE

FIELD OF THE INVENTION

The present invention relates to an element isolating method for compound semiconductor devices and a compound semiconductor device and, more particularly, to an element isolating technique for a single or an integrated compound semiconductor device.

BACKGROUND OF THE INVENTION

Figure 8A:
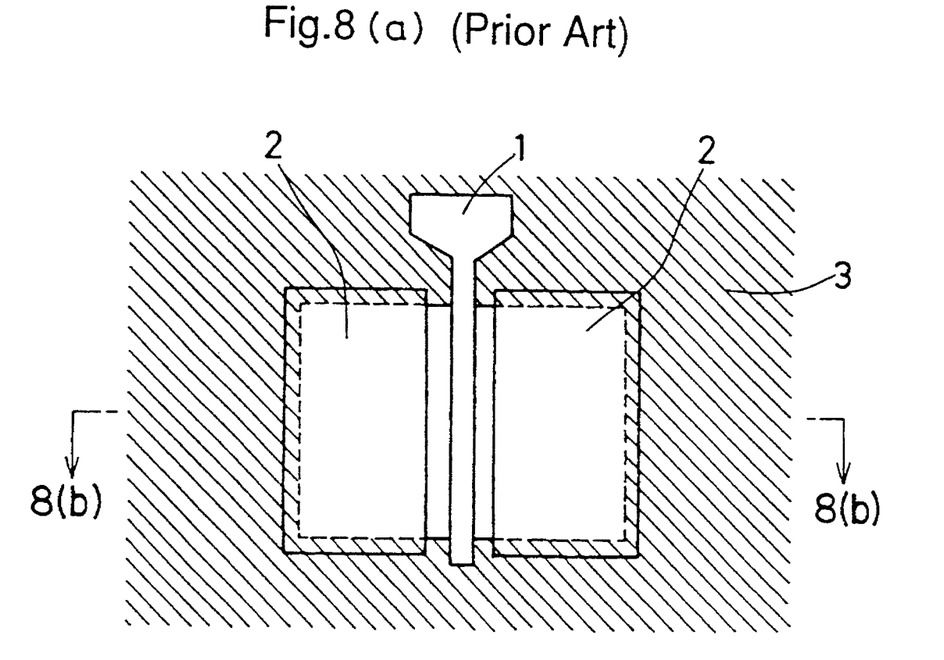
FIGS. 8(a) and 8(b) are respectively a plan view and a cross-sectional view illustrating a layer structure of a GaAs system MESFET in accordance with the prior art.
Figure 8B:
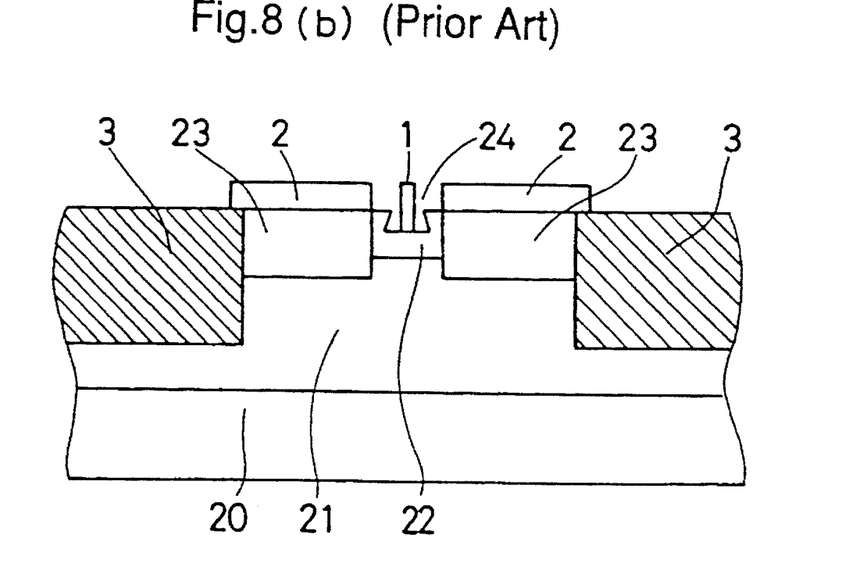

FIGS. 8(a) and 8(b) are diagrams illustrating a prior art compound semiconductor device where FIG. 8(a) is a plan view showing a device structure of GaAs system MESFET and FIG. 8(b) is a cross-sectional view along line 8b–8b of FIG. 8(a). In the figures, reference numeral 20 designates a GaAs substrate. A GaAs buffer layer 21 is disposed on the GaAs substrate 20. A low concentration $n^-$ type GaAs semiconductor layer 22 serving as a channel layer is produced by ion implantation in the buffer layer 21. High concentration $n^+$ type GaAs semiconductor layers 23 are produced by ion implantation at source and drain regions at both sides of the channel layer 22. A recess 24 is produced at a prescribed portion of the channel layer 22. A gate electrode 1 is disposed on the recess 24 and forms a Schottky junction. A first ion implantation region 3 as an insulating region for element separation is produced by ion implantation employing H or the like as an ion source at the entire periphery of the device region. Ohmic source and drain electrodes 2 are produced on the device region and a part of the insulating region. Here, the thick line in FIG. 8(a) shows the boundary of the metal electrodes.

The production method and the function of the device will be described.

An $n^-$ type GaAs semiconductor layer 22 of low dopant impurity concentration, above $1 \times 10^{17} cm^{-3}$, which serves as a channel layer is produced by impurity implantation in the buffer layer 21 having a dopant impurity concentration below $1 \times 10^{16} cm^{-3}$ produced on a GaAs semiconductor substrate 20. At the source and drain production regions sandwiching the gate production region in the $n^-$ type GaAs semiconductor layer, which serves as the channel layer, source and drain regions comprising $n^+$ type GaAs 23 having a high dopant concentration above $3 \times 10^{17} cm^{-3}$, are produced by ion implantation. Thereafter, insulation implantation is carried out into the entire crystal growth layers 21 and 22 at the periphery of the transistor using photoresist (not shown) as a mask, whereby first ion implantation regions 3 are produced element i.e., isolation. Thereafter, source and drain electrodes 2 are produced on the $n^+$ type GaAs semiconductor layer 23 simultaneously, and a portion of the $n^-$ type GaAs semiconductor layer 22 is recess etched to produce a recess 24 adjusting the device characteristics by utilizing a variation in saturation current between the source and drain electrodes. Thereafter, a gate electrode 1 is produced so as to form a Schottky junction in the recess 24.

In the GaAs system MESFET having the above-described structure, the current $I_{ds}$ between the source and the drain is controlled by the gate voltage applied to the gate electrode 1. In addition, in the GaAs system MESFET, device isolation is achieved by employing ion implantation.

In the GaAs system MESFET device in which the device isolation is performed by ion implantation as described above, there are problems in that variations in the gate junction breakdown voltage, particularly, reductions in the gate breakdown voltage are caused by process variations such as variations in the epitaxial wafer dependent on the wafer processing and variations in the gate processing or the like. In other words, when concentration an electric field occurs, the gate breakdown voltage is dependent on the intensity of the electric field, the attachment of the Schottky junction gate electrode, a wafer (bulk) state, and the manner of formation of the insulating interface between the insulating layer and the portion of the active layer of the FET, and these vary with processing variations.

Figure 10A:
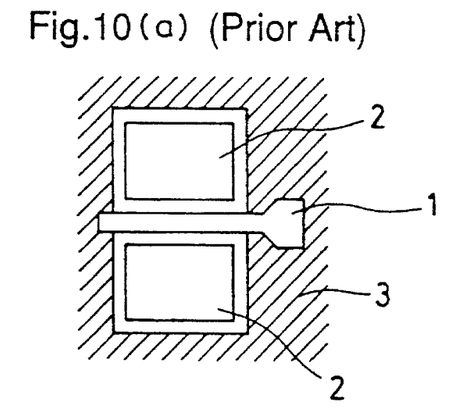
FIGS. 10(a) and 10(b) are diagrams for explaining problems in producing an ion region by insulating implantation in the prior art GaAs system MESFET.
Figure 10B:
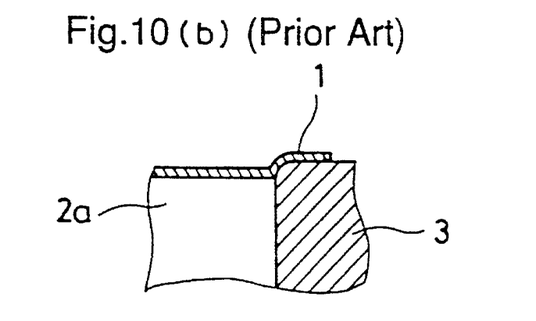

When concentration of an electric field occurs at a portion of the insulating interface between the insulating layer and the active layer of the FET dependent on these varying factors, there arises an interface leakage of a current. In a case of a recess type gate structure, because the etching rate is different between the insulating region and the active layer portion, a step due to etching is produced at the interface between the insulating region 3 and the active layer portion 2a as shown in FIG. 10(b), and when this step is fairly steep, it causes a discontinuity in the gate electrode 1 and destruction of the gate oxide film. As a result, the gate breakdown voltage is reduced so that gate destruction is likely to arise. Because of the reduction in the gate breakdown voltage the, reliability of the device is also reduced.

SUMMARY OF THE INVENTION

It is an object of the present invention to provide an element isolating method of a compound semiconductor device that keeps the gate breakdown voltage at a high value and has high reliability.

It is another object of the present invention to provide a compound semiconductor device that is produced by the above production method.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first embodiment of the present invention, an element isolating method for a compound semiconductor device includes, in order to secure a stable resistivity insulating region, carrying out a first ion implantation into the entire periphery of the device region, thereby producing a first insulating region functioning as an insulation destruction relaxing layer located in a buffer layer at the deepest position of layers epitaxially grown on a substrate containing the device. Thus, even when there is a redistribution of implanted ions in the depth direction during thermal processing in the wafer processing, the implanted ions diffuse so that the concentration of ions becomes uniform in the depth direction, and diffusion of ions implanted into the epitaxial layers containing charge carriers is suppressed. A thermally stable ion implantation concentration is obtained, and inter-element leakage current flowing through growth interface between the buffer layer and the layer containing carriers therein is also suppressed. Therefore, stable device characteristics in a compound semiconductor device are obtained and a highly reliable device is obtained. Thus, this method provides a highly reliable element isolating technique producing a stable insulating characteristic.

According to a second embodiment of the present invention, an element isolating method for a compound semiconductor device includes, assuming that a concentration of an electric field at the interface between the gate electrode and the insulating region may not occur even when a voltage is applied to the gate, in addition to producing a first insulating region defining a device region surrounded by the first ion implantation, producing a second insulating region by a second ion implantation, having a resistivity different from that of the first insulating region at a desired region of the device periphery. Therefore, an electric field concentration at the interface between a gate electrode and the insulating region is relaxed, preventing electro-static destruction at the gate part. Thereby a stable, high gate junction breakdown voltage is secured and, further, a simple design for a device is realized. Thus, this further provides a highly reliable element isolating technique and a highly reliable device.

According to a third embodiment of the present invention, the second insulating region is produced at portions where either or both of the root and an opposite end of a gate electrode and the boundary between the first insulating region and the device periphery region.

According to a fourth embodiment of the present invention, the second insulating region is produced in a prescribed width at the entire boundary between the first insulating region and the device periphery.

According to a fifth embodiment of the present invention, either or both of the first and the second insulating regions have an isolation destruction relaxing layer having a maximum of the ion implantation concentration in the buffer layer.

According to a sixth embodiment of the present invention, ion implantation is carried out to produce an insulating region employing a photoresist mask having a periphery corresponding to the device periphery with an edge varying in thickness or a step cross-section configuration comprising, for example, a first photoresist mask and a second photoresist mask of a thickness less than that of the first photoresist mask, and thereby the insulating region produced by the ion implantation has a planar or two-dimensional concentration distribution in the transverse direction. Therefore, electric field concentration at the interface between the gate and the insulating region is relaxed, resulting in a highly reliable element isolation having a stable insulating property and a highly reliable device.

DETAILED DESCRIPTION OF THE PREFERRED EMBODIMENTS

Embodiment 1

Figure 1:
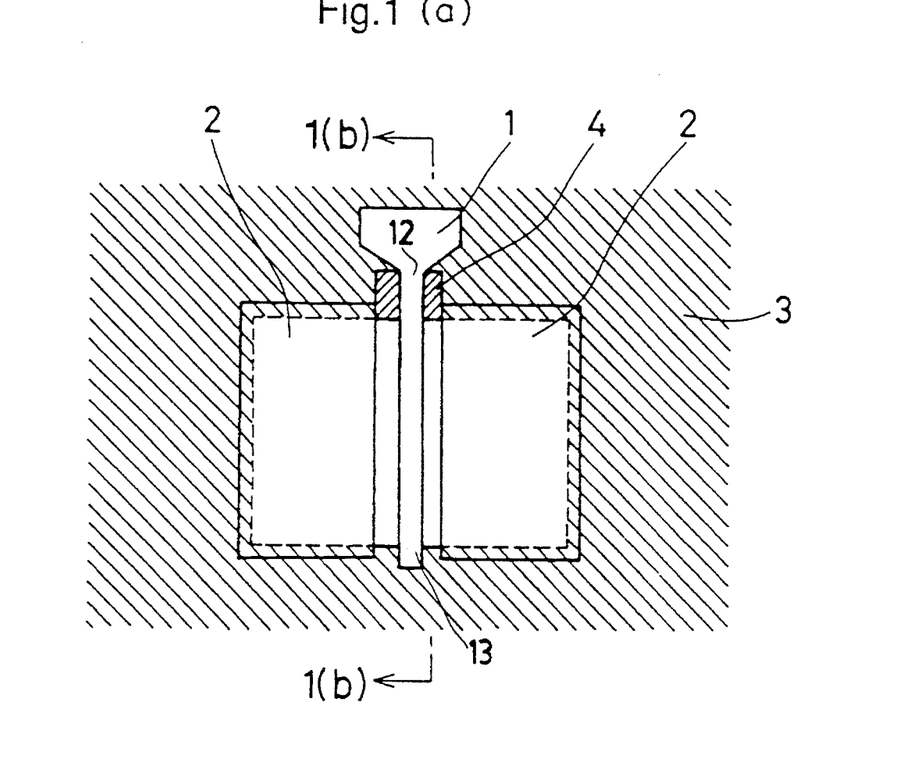
FIGS. 1(a) and 1(b) are respectively a plan view and a cross-sectional view illustrating a GaAs system MESFET in accordance with a first embodiment of the present invention.

FIGS. 1(a) and 1(b) show a GaAs system MESFET according to a first embodiment of the present invention. FIG. 1(a) is a plan view of a device structure of a GaAs system MESFET according to the first embodiment of the present invention, and FIG. 1(b) illustrates a cross-section along line 1b—1b of FIG. 1(a). The cross-section in line 1b—1b of FIG. 1(a) is the same as that shown in FIG. 8(b). In the figures, the reference numerals the same as those in FIGS. 8(a) and 8b designate the same or corresponding elements. Reference numeral 4 designates a second insulating region produced to have a resistance different from that of the first insulating region 3 and located at the boundary between the first insulating region 3 and the device periphery where a root 12 of the gate electrode 1 overlaps the device periphery. Here, the resistivity of the first ion implantation region 3 is $1 \times 10^7$ $\Omega$cm, and the resistivity of the second ion implantation region 4 is $1 \times 10^6$ $\Omega$cm.

The element isolating method by ion implantation in the manufacture of the compound semiconductor device of the present invention will be described below.

Figure 9:
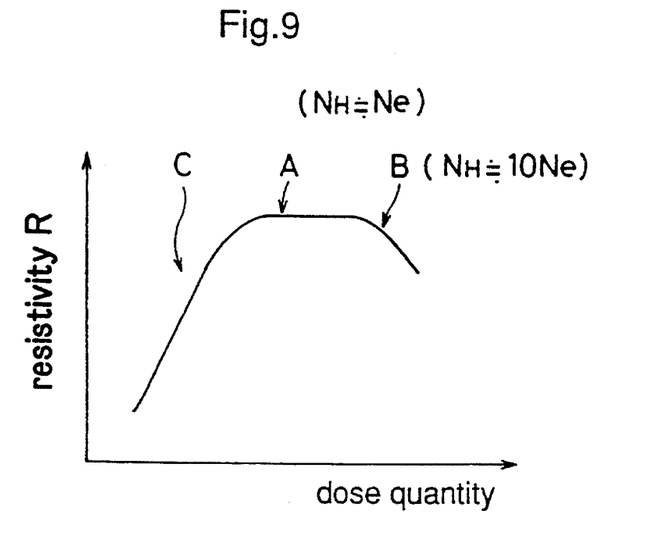
FIG. 9 is a diagram showing a relation between implanted dose quantity and resistance in an element isolating method by ion implantation.

When producing an insulating region by ion implantation, i.e., bombarding the semiconductor, with protons the dose quantity and the resistivity produced thereby has the relation shown in FIG. 9. The resistivity has three regions, i.e., region C where the resistivity increases with an increase of the dose quantity, region A where the resistivity is constant regardless of the increase of the dose quantity, and region B where the resistivity decreases with an increase of the dose quantity.

In the present invention, in order to relax the electric field between the insulating region and the active layer, a second ion implantation region 4 having a resistivity different from that of the first ion implantation region 3 is produced at a part of the region between the regions respectively underlying the source and drain electrodes 2, and in the device region surrounded by the first ion implantation region 3, thereby to relax the electric field concentration at the interface region. Here, the first and second ion implantation regions are produced by the ion implantations with the regions A and B of FIG. 9, respectively, or the ion implantations of the regions B and A of FIG. 9, respectively. Meanwhile, in order to provide a thermally stable device, ideally the first and second ion implantation regions are produced by ion implantation of the above-described regions A and B, respectively, because the region C is likely to become thermally unstable and unreliable. That a region is thermally unstable and unreliable means that carrier reactivation in which the insulation is destroyed by heat and the carriers are activated occurs where the insulation is produced by ion implantation. Here, the carrier reactivation time indicating the quality of the insulation, that is, how many hours the insulation is maintained before carrier reactivation occurs, is larger in the region B than in the region C.

In the graph shown in FIG. 9, when the implanted ions are protons (H), at the region A where $N_H=N_e$ ($N_H$ represents the concentration of protons in the implanted region, and $N_e$ represents the concentration of carriers (electron) in that region), the resistivity R is about $10^7$, $\Omega$cm, and at the region B where $N_H \approx 10 \, N_e$, the resistivity R of the graph decreases with an increase of the dose quantity.

Figure 7:
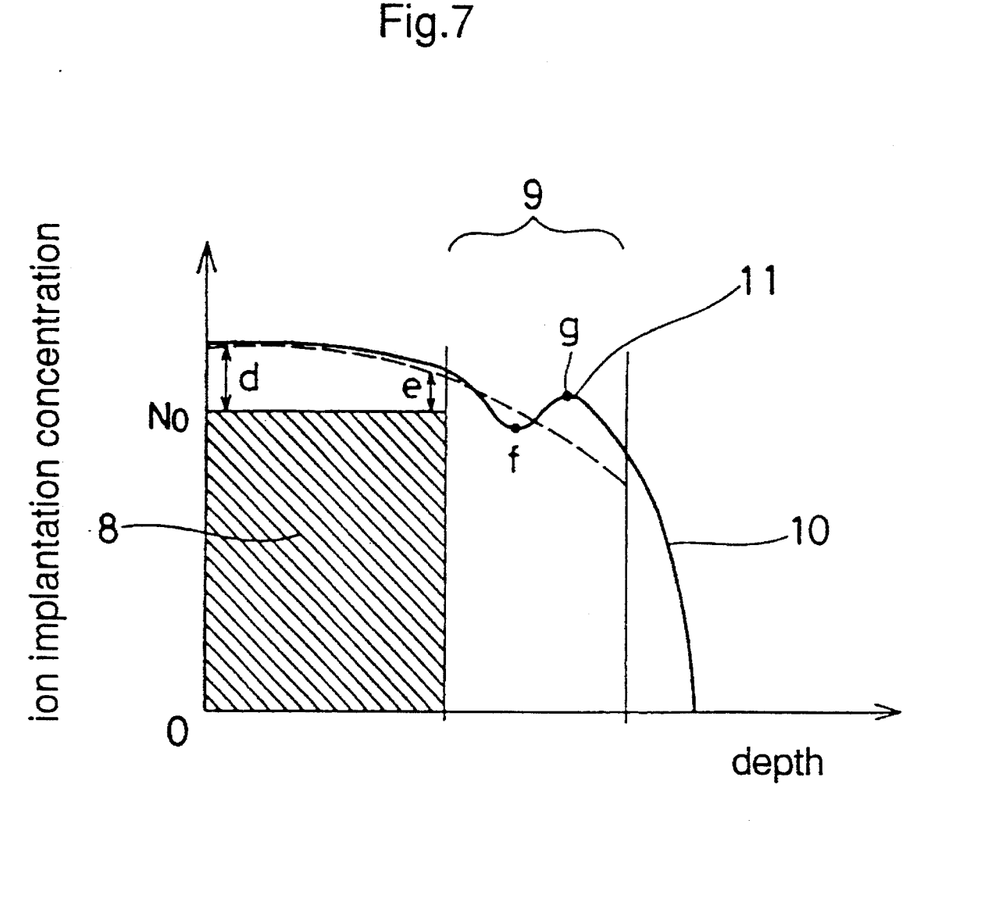
FIG. 7 is a diagram illustrating an ion implantation profile in an element isolating method by ion implantation in accordance with the first embodiment of the present invention.

FIG. 7 shows a carrier concentration profile produced by ion implantation according the present invention. While conventionally the ion implantation quantity is as shown by a broken line in the figure, the ion implantation quantity in this conventional method is quite close to the carrier concentration at the upper end of the carrier profile 8 at the interface between the buffer layer 9 and the semiconductor layer 21 disposed thereon. Therefore, the isolation is weak and carrier reactivation is likely to arise at this interface part. When thermal diffusion is carried out, the carrier profile is stable close to the device surface of the semiconductor layer 22 because there is a difference d between the ion implantation concentration and the carrier concentration, while at the interface of the buffer layer there is only a difference e and the ion implantation profile at that point has an inclination, whereby the ions are likely to flow to the left or the right (to deeper or shallower positions). Thereby, the above difference e approaches zero, meaning that the interface of the buffer layer is the weakest isolation, thereby insulation destruction begins at this point. In FIG. 7, the carrier concentration $N_e$ of the channel layer is about $1 \times 10^{19}$ cm$^{-3}$.

In order to relieve this insulation destruction, an isolation destruction relaxing layer having a maximum ion implantation concentration (point g) is provided in the buffer layer in the present invention, whereby the implanted ions at the left side and the right side of the point g in the graph move toward the minimum point f at the left side of the point g in the graph by the thermal diffusion, and on the other hand, the implanted ions in the vicinity of the interface of the buffer layer at the left side of the point f in the graph move toward the right side (toward the point f). Thus, ion concentration at the point having the difference e at the buffer layer interface is reduced and isolation is not weakened.

The position of the maximum point g is about 2000 to 5000 Å from the buffer layer interface, and the maximum point g is positioned in the buffer layer.

The concentration 10 at the point g having the maximum ion concentration produced in the buffer layer 9 at the deepest position of the epitaxial growth layers, is preferred to be equal to or larger than the carrier concentration of the carrier concentration of the active layer.

The ion implantation concentration according to the present invention is not limited to that shown in FIG. 7. The concentration at the point f and the point g may be the same and the concentration profile between these two points almost flat. When such an ion implantation concentration profile is employed, the same function and effect of the invention are obtained.

While the implanted hydrogen ions are spread in the depth direction from a position of high proton concentration to a position of low proton concentration by thermal diffusion after the ion implantation as described above, if the ion concentration profile is established so that the proton concentration at the position of lowest hydrogen concentration may not easily decline, the device becomes thermally stable and the device characteristics themselves are also stabilized.

In the present invention:

(1) when only the first insulating region is provided, the above-described ion concentration profile is applied to this first insulating region;

(2) when two insulating implantation regions, i.e., the first and the second, as in the first, the second, and the fifth embodiments, the above-described concentration profile is applied to the first implantation region;

(3) when two insulating implantation regions, i.e., the first and the second insulating regions are provided and the second insulating region is has a prescribed width at the the boundary between the first ion implantation region 3 and the device periphery region as in the fifth embodiment, the above-described concentration profile is applied to the first implantation region;

(4) in order to control the insulation resistance itself, the above-described concentration profile can be applied to both the first and the second insulating regions.

In other words, the first embodiment includes the first ion implantation region 3 having the same plan arrangement as the prior art device having the ion implantation concentration profile 10 shown by the solid line in FIG. 7, and the second ion implantation region 4 at the root 12 of the gate 1, i.e., the feeding point from the gate where the electric field concentration is the largest. The second ion implantation region 4 may be produced having the ion implantation concentration profile 10 shown by the solid line in FIG. 7. But this is not necessarily required.

In the first embodiment, since the first ion implantation region 3 includes a layer functioning as an isolation destruction relaxing layer having a peak ion implantation profile in the buffer layer, the diffusion of ions implanted into the epitaxial layers containing charge carriers is suppressed and a thermally stable ion implantation concentration is obtained. This can provide a stable insulating characteristic. In addition, the inter-element leakage current flowing through the growth interface between the buffer layer and the layer containing charge carriers is suppressed and a stable device characteristic is obtained, resulting in a highly reliable device.

In addition, because the second ion implantation region 4 having a resistance different from that of the first insulating region 3 is provided in the vicinity of the gate root 7 at the interface of the first insulating region 3 where the electric field concentration due to the gate is most likely to occur, the electric field concentration at the interface between the gate and the insulating region is relaxed, thereby preventing electro-static destruction at the gate. Thereby a stable high gate junction breakdown voltage is secured, and also a simple design for a device is realized. These features result in a more reliable element separating technique and a more reliable compound semiconductor device.

Embodiment 2

Figure 2A:
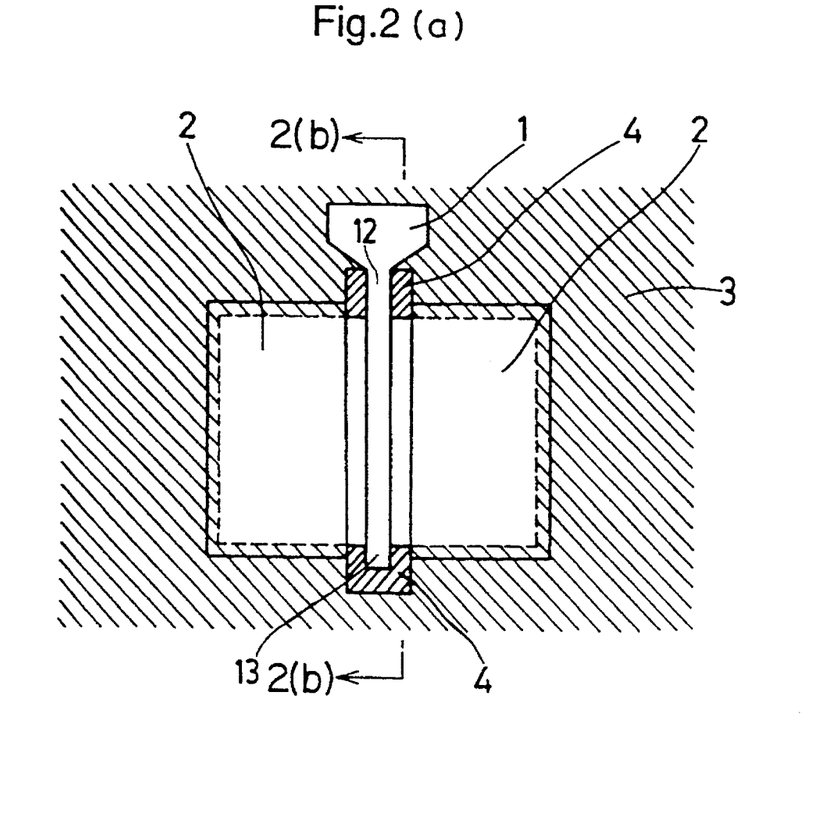
FIGS. 2(a) and 2(b) are respectively a plan view and a cross-sectional view illustrating a GaAs system MESFET in accordance with a third embodiment of the present invention.
Figure 2B:
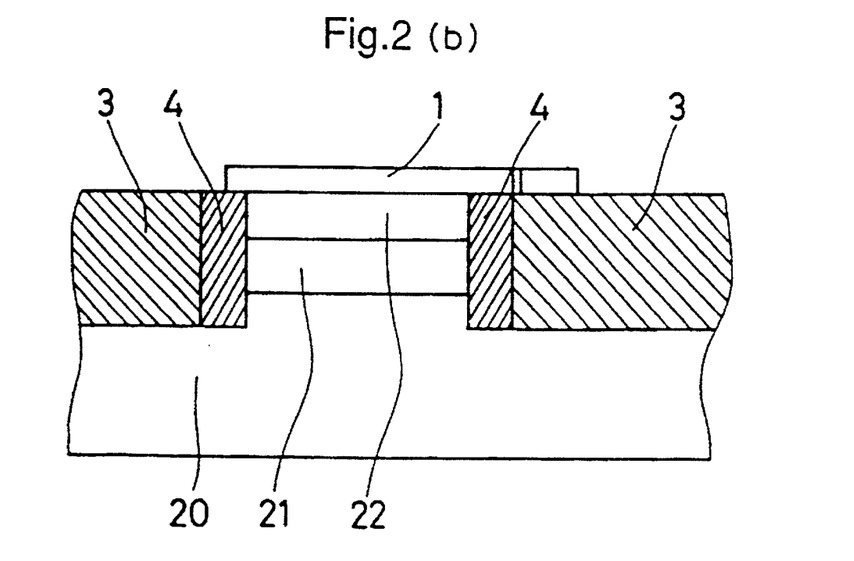

In a second embodiment of the present invention shown in FIG. 2a and 2(b), second ion implantation regions 4 are produced at the boundary between the first ion implantation region 3 as an insulating region and the device periphery, i.e. at the root of the gate electrode 1 where the electric field concentration is the most likely to occur and at the opposite end 13 of the gate electrode 1 where the electric field concentration is secondly most likely to occur, overlapping with the region 3. Also in this second embodiment, the first ion implantation region 3 has the ion implantation concentration profile 10 of FIG. 7, and the second ion implantation region 4 is not necessarily required to have the ion implantation concentration profile 10.

In this second embodiment, in addition to the effect of the first embodiment, the effect of relaxing the electric field concentration at the interface between the gate and the insulating region is increased by providing the second ion implantation region 4 at the end 13 of the gate electrode, and thus the stable insulating characteristic is further improved. Therefore, a more reliable element isolation is achieved and a more reliable compound semiconductor device is obtained.

Embodiments 3 and 4

While in the GaAs system MESFET of the above-described first and second embodiments the recess structure 24 is employed for the gate electrode 1, this gate electrode 1 can be of planar type, as in FIGS. 1(a) and 2(a), in third and fourth embodiments with the same effects as those in the first and second embodiments.

Embodiment 5

Figure 3A:
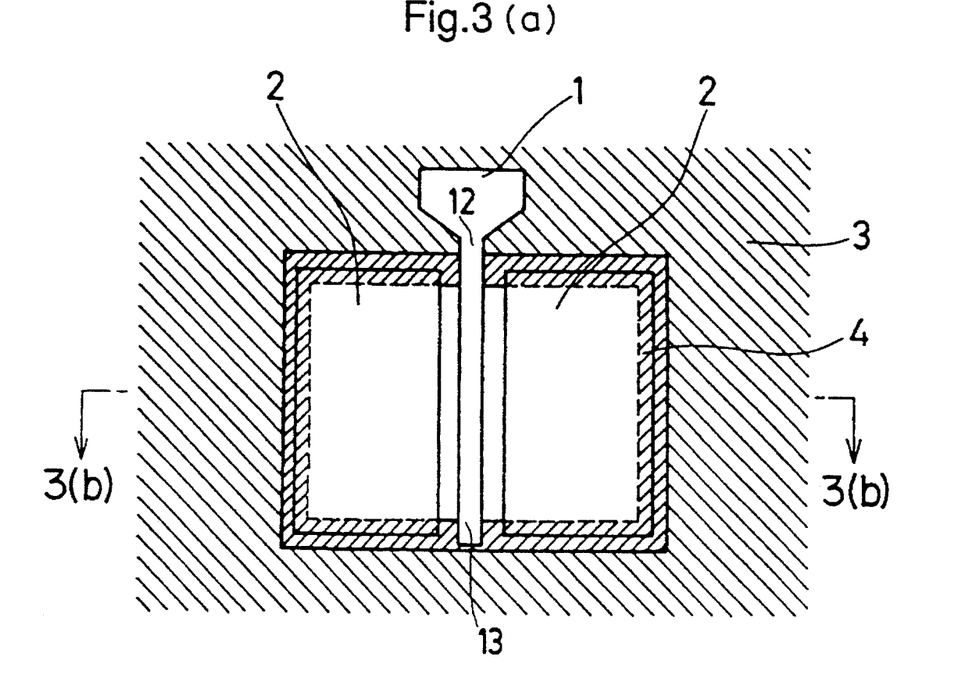
FIGS. 3(a) and 3(b) are respectively a plan view and a cross-sectional view illustrating a GaAs system MESFET in accordance with a fifth embodiment of the present invention.
Figure 3B:
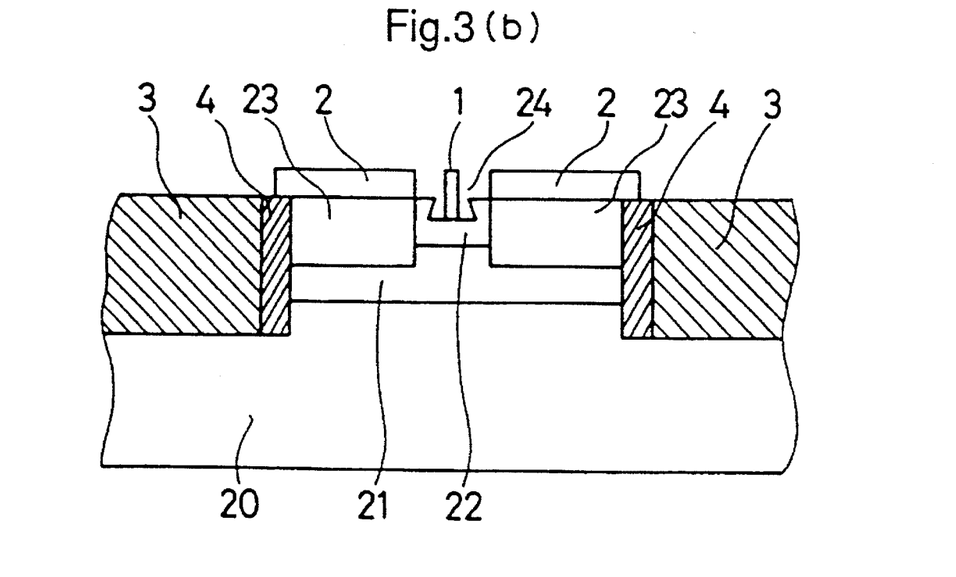

As a fifth embodiment of the present invention shown in FIGS. 3(a) and 3(b), in a GaAs system MESFET having a recess structure, the second ion implantation region 4 is produced in a prescribed width at the entire periphery of the device, i.e., at the boundary region between the first ion implantation region 3 and the device periphery region.

In this fifth embodiment, the first ion implantation region 3 has the ion implantation concentration profile 10 shown in FIG. 7 as in the first and second embodiments. The second ion implantation region 4 is produced in a prescribed width at the entire periphery of the device, i.e., at the boundary between the first ion implantation region 3 and the device periphery region. The second ion implantation region 4, if it has the above-described profile 10, functions more effectively.

In this fifth embodiment, a compound semiconductor device with a recess structure has the first ion implantation region 3 having a layer functioning as an isolation destruction relaxing layer having a peak in its ion implantation profile in the buffer layer, whereby the diffusion of ions implanted into the epitaxial layers containing charge carriers is suppressed and a thermally stable ion implantation concentration is obtained. Therefore, a stable insulating property is obtained and and inter-element leakage current flowing through the growth interface between the layer containing charge carriers and the buffer layer is suppressed, resulting in stable device characteristics and a highly reliable device.

Further, the second ion implantation regions 4 having a resistance different from that of the first insulating region 3 are provided at the entire periphery of the device region including the gate root and the gate end at the interface of the first insulating region 3, where electric field concentration is most likely to occur, whereby the electric field concentration at the interface between the gate or the like and the insulating region is relaxed, and a stable high gate junction breakdown voltage is secured. Thus, a more reliable device isolating technique and a more reliable device are obtained. Also a simple design for a device is realized.

Embodiment 6

Figure 4:
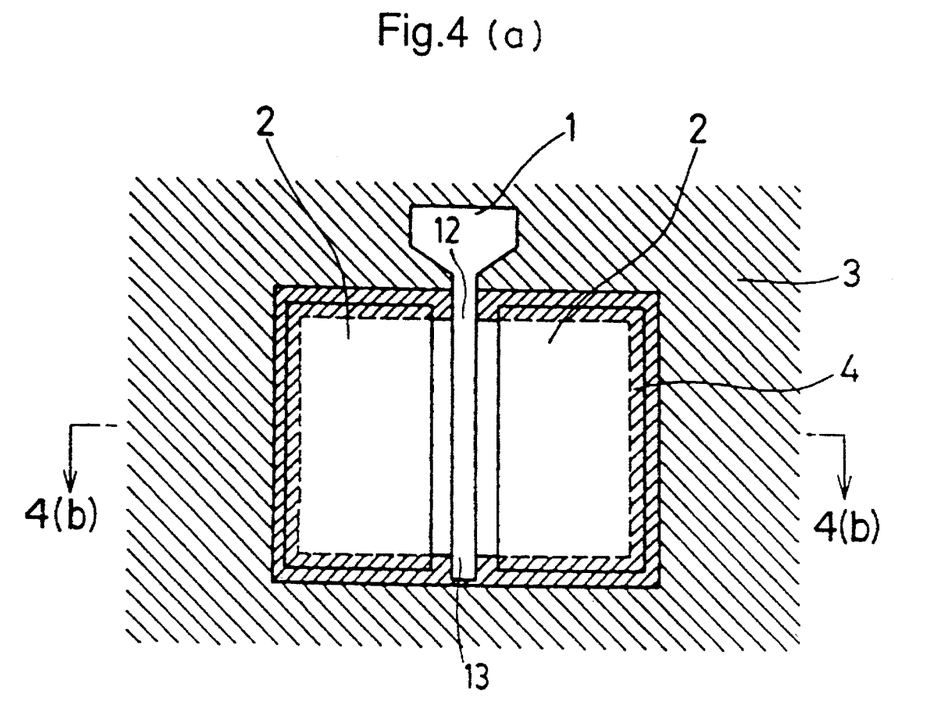
FIGS. 4(a) and 4(b) are respectively a plan view and a cross-sectional view illustrating a GaAs system MESFET in accordance with a sixth embodiment of the present invention.

In a sixth embodiment of the present invention shown in FIGS. 4(a) and 4(b), a GaAs system MESFET of a planar type, which is not of a recess structure, has the second ion implantation region 4 of a prescribed width at the entire boundary between the first ion implantation region 3 and the device periphery region.

Also in this sixth embodiment, the same effects as those in the fifth embodiment are obtained.

Embodiment 7

Figure 5:
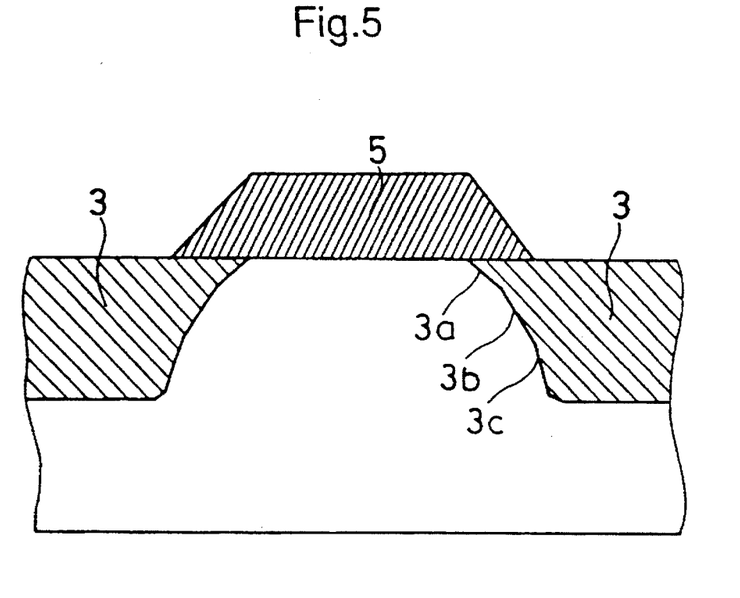
FIG. 5 is a cross-sectional view of a photoresist mask profile showing an element isolating method of a GaAs system MESFET by ion implantation in accordance with a seventh embodiment of the present invention.

FIG. 5 shows a seventh embodiment of the present invention. In the figure, reference numeral 3 designates an ion implantation region as an insulating region for isolating an element. A photoresist mask 5 having a peripheral part of diagonal cross section configuration i.e., that varies in thickness, is used as a mask for the first ion implantation. Such a photoresist mask 5 is obtained produced after photolithography by thermally reflowing the same.

In FIG. 5, if generally the photoresist has a vertical surface at its periphery, there arises a pinpoint electric field concentration so that the electric field is concentrated at the contact point of the photoresist with the insulating region, which is a semiconductor layer before ion implantation is performed. In this seventh embodiment, however, because the photoresist varies with thickness at the edge, the insulating region 3 produced in the semiconductor layer has sloped portions 3a, 3b, and 3c at its side surface as shown in the figure, and therefore, the pinpoint electric field concentration at these portions are turned into a linear concentration or a planar (or two-dimensional) concentration of electric field, and the electric field concentration is relaxed more than in a case where the photoresist has an edge perpendicular to the surface. Therefore, the electric field concentration at the interface between the gate or the like and the insulating region is relaxed, whereby a stable insulating characteristic is obtained. Thus, a more reliable element isolating technique and a more reliable device are obtained.

Embodiment 8

The above-described seventh embodiment can be realized also in a recess structure FET as shown in FIG. 3(b), and this provides an eighth embodiment.

Embodiment 9

Figure 6:
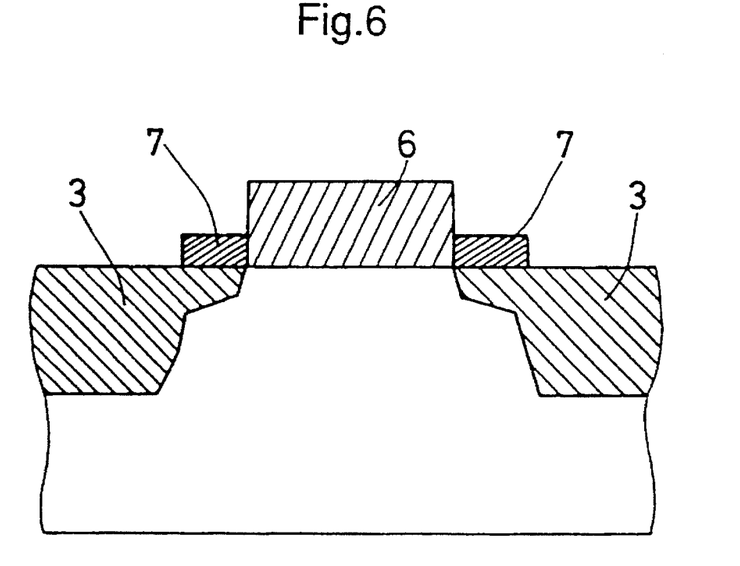
FIG. 6 is a cross-sectional view of a photoresist mask profile showing an element isolating method of a GaAs system MESFET by ion implantation in accordance with a ninth embodiment of the present invention.

FIG. 6 shows a ninth embodiment of the present invention. In the figure, reference numeral 3 designates an ion implantation region for isolating an element. A first photoresist mask 6 is used for ion implantation. A second photoresist mask 7 having a thickness less than that of the first photoresist mask is disposed at the periphery of the first photoresist mask 6.

In the seventh embodiment, the side surfaces of the photoresist effectively change in thickness, whereby a planar or two-dimensional concentration distribution of the electric field in the transverse direction is produced in the insulating region. In this result ninth embodiment, this is realized by employing two photoresists. More particularly, the second photoresist 7 of a thickness less than that of the first photoresist 6 is provided at the sides of the first photoresist 6, and proton bombardment is carried out using the second photoresist 7 as a mask, whereby an insulating implantation region 3 shown in FIG. 6 is obtained. This provides a two-dimensional concentration distribution of the electric field in all directions in the transverse direction. In this embodiment, photolithography for producing the photoresist is required to be carried out two times, complicating the process a little, but pinpoint electric field concentration at the interface of the insulating region can be greatly relaxed by being turned into a linear or one-dimensional concentration or a planar or two-dimensional concentration similarly as in the seventh embodiment, whereby electric field concentration at the interface between the gate or the like and the insulating region is relaxed as in the seventh embodiment. Thus, a more reliable element isolating technique and a more reliable device having a stable insulating property are obtained.

Embodiment 10

The above-described ninth embodiment can be realized also in a recess structure FET as shown in FIG. 3(*b*), and this provides a tenth embodiment.

In the above-described embodiments, a GaAs system MESFET is described, but the present invention can be also realized in a semiconductor device comprising other materials, and the same effects as those described above are obtained.

In the above-described embodiments, as ions implanted to produce an insulating region, protons (hydrogen) (H) are mainly used, but, one or more kinds of ions selected among hydrogen (H), boron (B), and oxygen (O) can be employed with the same effects as those described above.

What is claimed is:

1. A method of isolating compound semiconductor devices by ion implantation comprising:

implanting ions in a compound semiconductor substrate including epitaxially grown layers to produce an insulating region so that the concentration of implanted ions has a peak at a position deeper than a prescribed depth in a buffer layer, the deepest of the epitaxially grown layers.

2. The method of claim 1 wherein the peak implanted ion concentration is at least equal to the carrier concentration of an active layer of the epitaxially grown layers.

* * * * *